(12) United States Patent
Takahashi et al.

(10) Patent No.: US 7,902,463 B2
(45) Date of Patent: Mar. 8, 2011

(54) PRINTED WIRING BOARD AND METHOD OF MANUFACTURING THE SAME

(75) Inventors: Michimasa Takahashi, Ogaki (JP);
Yukinobu Mikado, Ogaki (JP);
Hiroyuki Yanagisawa, Ogaki (JP)

(73) Assignee: Ibiden, Co. Ltd., Ogaki-shi (JP)

( * ) Notice: Subject to any disclaimer, the term of this patent is extended or adjusted under 35 U.S.C. 154(b) by 276 days.

(21) Appl. No.: 11/844,788

(22) Filed: Aug. 24, 2007

(65) Prior Publication Data
US 2008/0185172 A1    Aug. 7, 2008

Related U.S. Application Data

(60) Provisional application No. 60/888,377, filed on Feb. 6, 2007.

(51) Int. Cl.
*H05K 1/00* (2006.01)
(52) U.S. Cl. .......................... 174/258; 361/760
(58) Field of Classification Search .......... 174/255–258; 361/760–764; 257/687–691, 788; 29/610.1; 438/381–384
See application file for complete search history.

(56) References Cited

U.S. PATENT DOCUMENTS

| | | | | |
|---|---|---|---|---|
| 5,173,150 A | * | 12/1992 | Kanaoka et al. | 216/20 |
| 6,444,083 B1 | * | 9/2002 | Steger et al. | 156/345.48 |
| 7,323,762 B2 | * | 1/2008 | Lai et al. | 257/536 |
| 7,351,915 B2 | * | 4/2008 | Ahn et al. | 174/260 |
| 2002/0179329 A1 | | 12/2002 | Fukuoka et al. | |
| 2005/0008868 A1 | * | 1/2005 | Nakamura et al. | 428/414 |
| 2009/0008142 A1 | * | 1/2009 | Shimizu et al. | 174/261 |
| 2009/0046409 A1 | * | 2/2009 | Kweon et al. | 361/303 |

FOREIGN PATENT DOCUMENTS

| | | |
|---|---|---|
| CN | 1404353 A | 3/2003 |
| DE | 41 13 231 A1 | 10/1991 |
| EP | 1 265 466 A2 | 12/2002 |
| JP | 2-58890 | 2/1990 |
| JP | 04-005887 | 1/1992 |
| JP | 11-004056 | 1/1999 |
| JP | 11-045955 | 2/1999 |
| JP | 11-103170 | 4/1999 |
| JP | 2003-92460 | 3/2003 |
| JP | 2003-152301 | 5/2003 |

* cited by examiner

*Primary Examiner* — Jeremy C Norris
*Assistant Examiner* — Yuriy Semenenko
(74) *Attorney, Agent, or Firm* — Oblon, Spivak, McClelland, Maier & Neustadt, L.L.P.

(57) ABSTRACT

A printed wiring board includes an insulation layer having a surface, electrodes embedded in the insulation layer, a resistor formed on the surface of the insulation layer and electrically connected to the electrodes, and an external connection conductive pattern formed over the surface of the insulation layer and electrically connected to one or more electrodes. The insulation layer and the electrodes form a component-mounting surface on the surface of the insulation layer, the component-mounting surface is substantially leveled with the surface of the insulation layer and includes a resistor forming region on which the resistor is formed, and the external connection conductive pattern is separated by a space from the resistor.

26 Claims, 14 Drawing Sheets

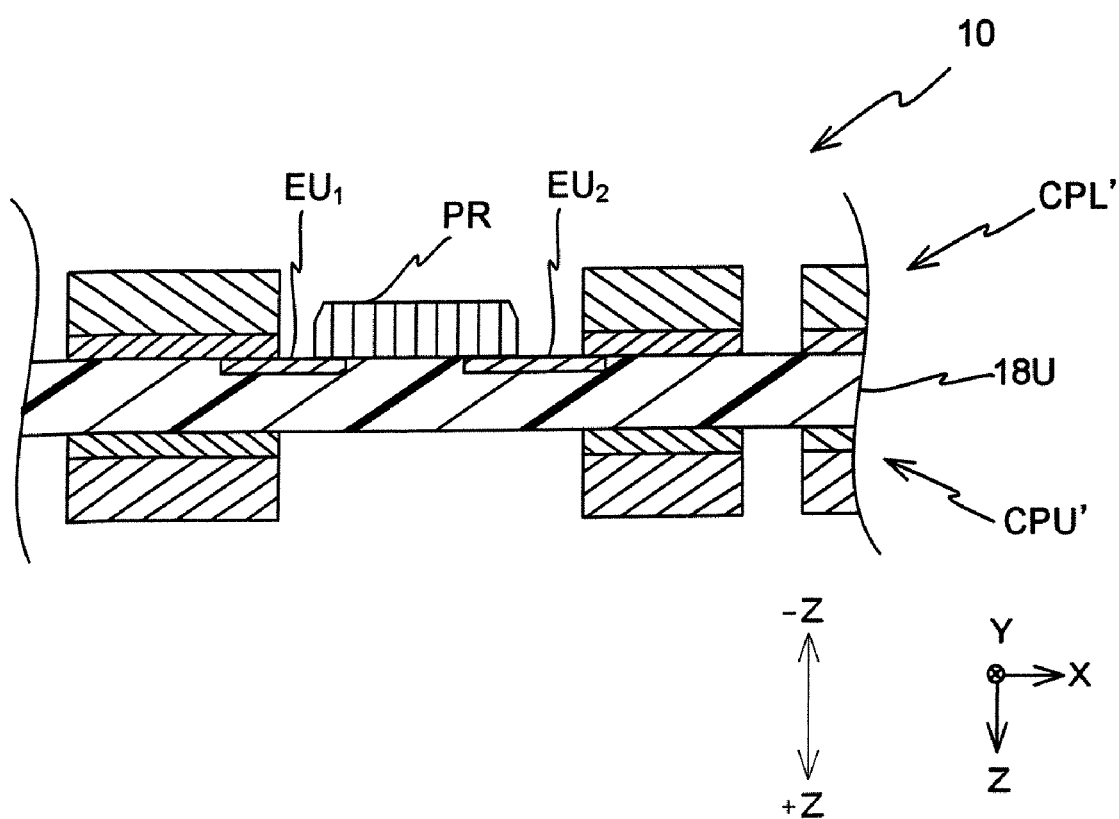

Fig. 8C
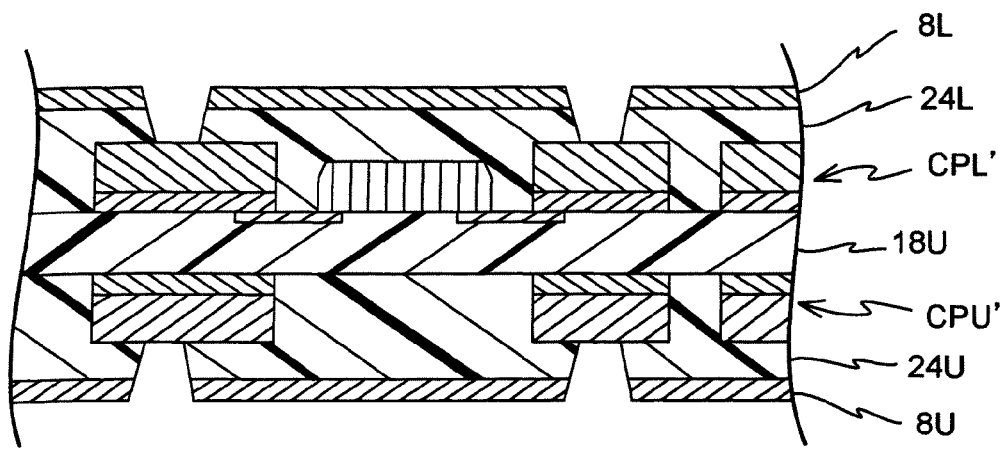
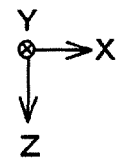
Fig. 8D
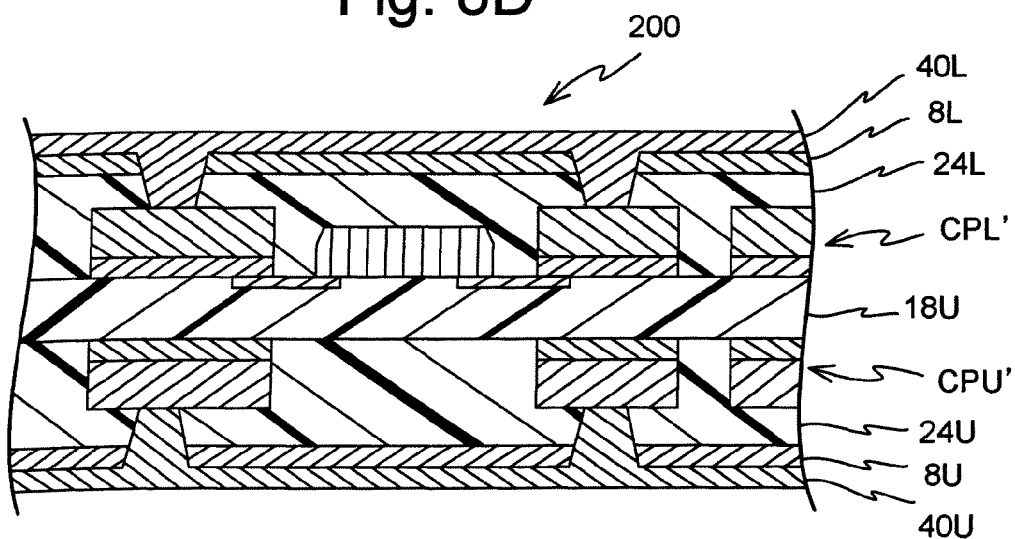
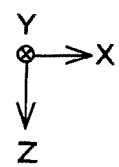

Fig. 10
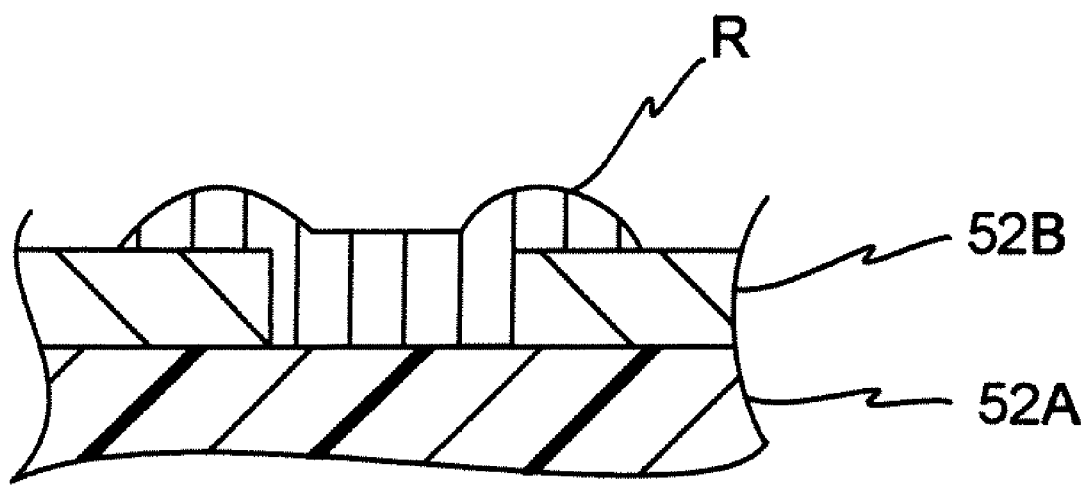
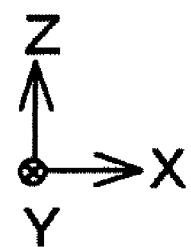

PRINTED WIRING BOARD AND METHOD OF MANUFACTURING THE SAME

CROSS-REFERENCE TO RELATED APPLICATIONS

The present application claims the benefit of priority to U.S. application Ser. No. 60/888,377, filed Feb. 6, 2007. The contents of this application are incorporated herein by reference in their entirety.

BACKGROUND OF THE INVENTION

1. Field of the Invention

The present invention relates to a printed wiring board (hereinafter referred to as a PWB) and a method of manufacturing a PWB. More specifically, the present invention relates to a PWB having a resistor element and a method of manufacturing such a PWB.

2. Discussion of the Background

According to Japanese Unexamined Patent Publication 11-4056, a resistor element is formed by a screen printing method as follows. First, an insulation material layer and a conductive material layer are laminated together and a predetermined conductive pattern is formed by a photo-etching method on the insulation material layer. Then, an undercoat layer is formed between the predetermined conductive patterns formed on the insulation material layer. By screen-printing a carbon paste on the undercoat layer and the edge of the conductive pattern adjacent to the undercoat layer, a resistor element is formed. A paste may be applied directly on a resin without forming an undercoat layer. The contents of this publication are incorporated herein by reference in their entirety.

SUMMARY OF THE INVENTION

According to one aspect of the present invention, a printed wiring board includes an insulation layer having a surface, electrodes embedded in the insulation layer, a resistor formed on the surface of the insulating layer and electrically connected to the electrodes, and an external connection conductive pattern formed over the surface of the insulating layer and electrically connected to one or more electrodes. The insulation layer and the electrodes form a component-mounting surface on the surface of the insulation layer, the component-mounting surface is substantially leveled with the surface of the insulation layer and includes a resistor forming region on which the resistor is formed, and the external connection conductive pattern is separated by a space from the resistor.

According to another aspect of the present invention, a printed wiring board includes an insulation layer having a surface, electrodes embedded in the insulation layer, a resistor formed on the surface of the insulation layer and electrically connected to the electrodes, and an external connection conductive pattern formed over the surface of the insulation layer and electrically connected to one or more electrodes. The insulation layer and the electrodes form a component-mounting surface on the surface of the insulation layer, the component-mounting surface is leveled with the surface of the insulation layer and includes a resistor forming region on which the resistor is formed, and the resistor has a thickness which is set to be less than a thickness of the external connection conductive pattern.

According to yet another aspect of the present invention, a manufacturing method of a printed wiring board includes forming electrodes on a conductive layer formed on a substrate by a plating method, forming an insulation layer on the electrodes and the conductive layer, removing the substrate from the conductive layer, patterning the conductive layer except for a resistor forming region reserved for forming a resistor, thereby forming an external connection conductive pattern, and forming a resistor in the resistor forming region such that the resistor is separated by a space from the external connection conductive pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a schematic cross-sectional view of a PWB having a resistor element according to one embodiment of the present invention;

FIG. 8C is an illustration to describing yet another manufacturing step for a PWB where the PWB shown in FIG. 1 is embedded in an internal layer (the third step);

FIG. 8D is an illustration describing yet another manufacturing step for a PWB where the PWB shown in FIG. 1 is embedded in an internal layer (the fourth step);

FIG. 10 is an illustration showing a conventional resistor.

DESCRIPTION OF THE EMBODIMENTS

Figure 2A:
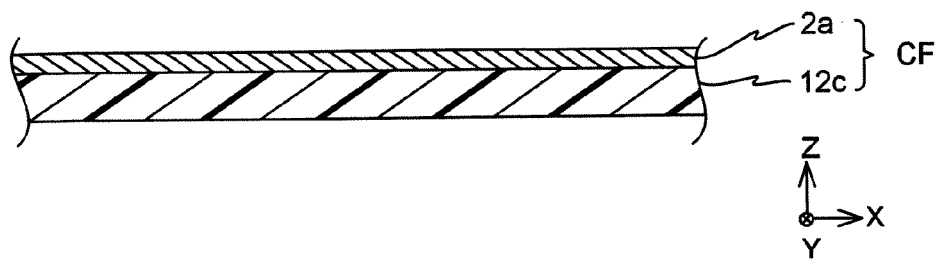
FIG. 2A is an illustration describing a manufacturing step for the PWB shown in FIG. 1 (the first step)

The embodiments will now be described with reference to the accompanying drawings, wherein like reference numerals designate corresponding or identical elements throughout the various drawings.

A PWB according to one embodiment of the present invention is described below. As described above, a PWB according to one embodiment of the present invention has an insulation layer, multiple electrodes, a resistor formed in the resistor forming region, and an external connection conductive pattern. A resistor element formed in the PWB is constructed with the electrodes, the conductive pattern and the resistor.

The resistor element is formed between the multiple electrodes and electrically connects the electrodes, each of which is connected to an external connection wiring pattern (a conductive layer). The multiple electrodes are embedded in a surface of the insulation layer and form a component-mounting surface with the surface of the insulation layer. The substrate surface and the embedded electrode surfaces are made substantially leveled and form an element-mounting surface which is almost flat. The resistor forming region includes sections of the surfaces of the electrodes on the component-mounting surface. The resistor physically contacts with the electrodes with a predetermined contact surface area on the element-mounting surface. Thus, the resistance value can be stabilized.

Here, the resistor is separated by a space from the conductive pattern and does not physically contact with the conductive pattern (The external connection conductive pattern is separated by a space from the resistor and formed in a region that excludes the resistor forming region but includes the sections of the surfaces of the electrodes on the component-mounting surface). By keeping the conductive pattern and the resistor from physically contacting with each other, electron migration is prevented between the resistor and the conductive pattern which are made with a metal, and thus corrosive reactions are suppressed accordingly. As a result, fluctuation in resistance value caused by corrosive reactions is suppressed and the resistance value can be stabilized.

Also, as described above, a resistance value of the resistor element formed in a conventional PWB are affected by the thickness of the conductive pattern and fluctuate accordingly. Especially, if the width of the conductive pattern is small, the impact is larger. However, since the resistor is set not to physically contact with the conductive pattern according to the structure of one embodiment of the present invention, fluctuation of the resistance value, which is influenced by change of the conductor thickness, can be smaller. By setting the resistor not to physically contact with the conductive pattern at all, the above-described influence can be eliminated.

The resistor element formed in the PWB according to one embodiment of the present invention can further include an element-mounting region excluding the area where the resistor is formed, and an external connection conductive pattern. The external connection conductive pattern is formed on the region, excluding sections of electrodes which are part of the element-mounting surface. Namely, the resistor element has an external connection wiring pattern. The resistor and the wiring pattern are electrically connected through the electrodes.

And the resistor is formed without covering the external connection wiring pattern. Also, the contact surface area between each electrode and the resistor is set constant. Accordingly, the resistance values of the resistor element are stabilized.

In addition, the electrodes are made of the primary metal and a contained element. The "contained element" indicates an element contained in the electrodes in a predetermined amount when the electrodes are formed. As the primary metal, nickel is preferred, being resistant to corrosion from acid or alkali and easy to process. As a contained element, phosphorus is preferred.

When forming electrodes, nickel, combined with the later-described amount of a contained element, can prevent the formation of pinholes, which is a factor in hampering a stable resistance value. As a result, the surface in contact with the electrodes is made flat and smooth, and the contact surface area is kept constant, thereby stabilizing the resistance value. Among the above-mentioned metals, nickel is further preferred, since nickel makes a dense film and thus more easily stabilizes a resistance value.

When forming the above electrodes by using nickel and phosphorus, the phosphorus content is preferred to be in the approximate range of 9-11 wt. pct. When making the above electrodes by using nickel and phosphorus, if the phosphorus content is in the approximate range of 9-11 wt. pct., pinholes are not formed on the electrode surfaces, thus sufficiently even surfaces are achieved. Furthermore, since the bonding strength between in nickel crystals is high, it is possible to produce a resistor which is resistant to corrosion from heat and chemical solutions containing acid or alkali and has sufficiently high resistance values.

As described above, by using nickel, combined with phosphorus in the approximate range of 9-11 wt. pct., a resistor element can be produced that has sufficiently even electrode surfaces and is resistant to corrosion from heat and corrosion from chemical solutions containing acid or alkali. In addition, resistance values of such a resistor element seldom fluctuate when used in a high-temperature air atmosphere.

Moreover, in the PWB according to one embodiment of the present invention, the thickness of the above resistor is preferred to be less than that of the above conductive layer. If the thickness of the resistor is greater than that of the conductive layer, the resistor becomes disfigured from pressure during the lamination process, and the disfigurement causes a fluctuation of resistance values. However, if the thickness of the resistor is less than that of the conductive layer as described above, the fluctuation of resistance values caused by such disfigurement can be prevented. Also, solder-resists on the resistor can be formed well by a printing method. Furthermore, it is possible to laminate another resistor directly on top of the resistor which has been formed as described above.

Also, employing a resistor element having the above-described structure can reduce pressure on the resistor when laminating other layers via a prepreg. As a result, a factor in fluctuating resistance values can be decreased. Accordingly, a resistor element whose resistance values show a small fluctuation from the designed value can be mounted.

A PWB according to the second embodiment of the present invention has an insulation layer, multiple electrodes, a resistor formed in the resistor forming region, and an external connection conductive pattern. And a resistor element is structured the same as in the above-described PWB according to the first embodiment, and electrically connects each of the electrodes. The thickness of the resistor is set to be less than that of the external connection conductive pattern. Also, since the electrodes are formed the same way, the resistance value can be stabilized.

In the above, the thickness of the resistor is set to be less than that of the external connection conductive pattern. Accordingly, when embedding the resistor and the external connection conductive pattern in the insulation layer, the resistor can be securely embedded without receiving unnecessary pressure and fixed. As a result, connection reliability can be improved.

Also, the thickness of an insulation layer to be formed in the area where the resistor is embedded can be formed to be the same as or greater than that of the insulation layer where the conductive pattern is embedded. Insulation reliability can be improved accordingly. Furthermore, when forming an insulation layer for embedding the resistor and external connection conductive pattern, disfigurement of the resistor from pressure and resultant fluctuation of resistance values can be prevented by using, for example, a prepreg containing an inorganic filler or fibers, and laminating it by applying pressure and heat.

In addition, when pressure is applied, it is not intensively loaded on the resistor, thus preventing breakage from pressure. Accordingly, a factor in fluctuating a resistance value can be decreased and a resistor element having a resistance value with a small disparity from the designed value can be mounted.

In the above resistor element formed in the PWB according to one embodiment of the present invention, the above resistor and the wiring pattern are electrically connected via electrodes. The resistor is formed without covering the external connection wiring pattern, and the surface area where each electrode comes in contact with the resistor is made constant, thereby stabilizing the resistance value of the resistor element.

In the second embodiment of the present invention, interlayer connection via-holes are preferred to be formed in the other insulation layer where the above external connection conductive pattern is embedded. Here, the above interlayer connection via-holes are preferably filled with a conductive resin so that cracks in the interlayer connecting portions caused by heating and cooling can be prevented. The conductive resin is preferably one selected from a group that includes silver paste and copper paste, since each has good electrical conductivity.

Also, filling the above interlayer connection via-holes with a metal by plating is preferred, since cracks in the interlayer connection portions caused by heating and cooling are prevented, and electrical resistance at the interlayer connection is reduced. The metal to be used is preferably one selected from a group that includes copper, silver and aluminum, since each has excellent electrical conductivity.

The above electrodes and others are structured the same as in the above-mentioned first embodiment. Therefore, a resistor having corrosion resistance and a sufficiently high resistance value can be manufactured, while sufficiently even surfaces are maintained.

A PWB according to the third embodiment of the present invention has an insulation layer, multiple electrodes, a resistor formed in the resistor forming region, and an external connection conductive pattern. The multiple electrodes are embedded in an surface of the insulation layer and form a component-mounting surface with the surface of the insulation layer. The resistor forming region includes sections of the surfaces of the electrodes on the component-mounting surface. The external connection conductive pattern is formed on the component-mounting surface, excluding the resistor forming region but including part of the electrode surfaces, and is separated from the resistor by a space (The external connection conductive pattern is separated by a space from the resistor and formed in a region that excludes the resistor forming region but includes sections of the electrode surface on the component-mounting surface). In addition, the thickness of the resistor is set to be less than that of the external connection conductive pattern.

By making a space between the resistor and the external connection conductive pattern, as in the PWB according to the above-described first embodiment, corrosion resistance can be improved. Furthermore, the existence of the space can reduce the impact transmitted to the resistor and thus heighten its drop impact resistance. Also, as described above, by forming the thickness of the resistor to be less than that of the external connection conductive pattern, connection reliability and insulation reliability can be improved while preventing breakage of the resistor caused by pressure.

When forming interlayer connection via-holes in the PWB according to the above third embodiment, they can be formed in the same way as in the above-mentioned second embodiment. Such via-holes may be filled with above-described conductive resin or may be filled with metal by plating. For such a resin and metal, the same resin and metals listed above can be used.

Also, as described above, one embodiment of the present invention is a method of manufacturing a PWB, featuring an electrode forming step, an insulation-layer forming step, a substrate removing step, a patterning step and a resistor forming step (The manufacturing method includes an electrode-forming step using a plating method to form electrodes on a surface of the conductive layer disposed on the substrate surface; an insulation-layer forming step to form an insulation layer on the electrodes and the conductive layer; a substrate-removing step to remove the substrate from the conductive layer; a patterning step to pattern the conductive layer formed in the area excluding the resistor forming region; and a resistor forming step to form a resistor to be separated by a space from the patterned conductive layer in the resistor forming region).

By carrying out as such, the contact surface between the resistor and the conductive layer is set constant and the fluctuation in a resistance value is suppressed. It is possible to manufacture a PWB with a resistor element with a highly accurate resistor having a resistance value that would seldom change despite heat from surface treatment, or heat and pressure from laminating another layer on top of the resistor element via a prepreg.

In the above resistor forming step, it is preferred to form a resistor by a printing method in the resistor forming region. In the above resistor forming region, as described above, the substrate surface and the embedded electrode surfaces form an almost flat surface. Accordingly, if the resistor is formed by a printing method, change in the resistor configuration after printing is small and a high resolution can be achieved. As a result, the resistance value seldom fluctuates.

From a productivity point of view, the above printing method is preferably screen printing or ink-jet printing. A carbon paste is preferred for printing, since it can produce a resistor with a high resistance value. By using such a nano-paste, it is possible to produce a highly accurate resistor. Also, the above conductive pattern and resistor are preferred to be separated by a space. The reason for this has been described earlier.

As described above, the electrodes are preferably made of nickel. It is more preferable for the nickel to contain a predetermined amount of phosphorus, since the evenness of electrode surfaces can be maintained, the level of resistance to corrosion from heat or chemical substances such as acid or alkali is high, the resistance value fluctuation is small when used in a high-temperature atmosphere, and so on. When the primary metal is nickel, the content of the above phosphorus is preferably in the approximate range of 9-11 wt. pct. to maintain an evenness of surface and prevent the formation of pinholes on the electrode surfaces. It is more preferable for the phosphorus content to be approximately 10 wt. pct.

From the above reasons, the thickness of the resistor is preferred to be less than that of the conductive layer. By following the above manufacturing method of a PWB, the resistance value can be stabilized, thus a highly accurate resistor with a high resistance value can be manufactured.

A resistor element according to one embodiment of the present invention has the advantage of providing a resistor free of the effects of varying thicknesses of the electrodes. By following the manufacturing method of a PWB according to one embodiment of the present invention, a PWB can be produced that has a mounted resistor with a stable, high resistance value. Moreover, with reference to a PWB according to one embodiment of the present invention, a PWB can be produced that has a resistor with a stable, high resistance value.

Referring to FIGS. 1-9, one embodiment of the present invention is described below. FIG. 1 is an X-Z cross-sectional view of PWB 10 with a mounted resistor element according to one embodiment of the present invention.

As illustrated in FIG. 1, PWB 10 has (a) insulation layer (18U); (b) two electrodes ($EU_1$, $EU_2$), embedded in insulation layer (18U) in the minus-Z dimension (hereinafter may be referred to as the (−Z) surface); (c) conductive pattern (CPL'), formed on the (−Z) surface of insulation layer (18U); and (d) resistor (PR), formed on the component-mounting surface, the component-mounting surface being formed with electrodes ($EU_1$, $EU_2$) and the (−Z) surface of insulation layer (18U). The resistor element has resistor (PR), electrodes ($EU_1$, $EU_2$), and a partial area of conductive pattern (CPL') which is electrically connected to electrodes ($EU_1$, $EU_2$). Further, PWB 10 has (e) conductive pattern (CPU'), formed on the plus Z-dimension (hereinafter referred to as the (+Z) surface) of insulation layer (18U), and (g) conductive pattern (CPU').

As material for insulation layers (14, 18U, 18L), epoxy-resin, epoxy-resin blended with inorganic fillers such as silica, glass-cloth immersed in epoxy-resin (hereinafter may be referred to as "glass-epoxy" or "prepreg"), polyimide or the like, may be used. Among those, glass-epoxy is preferred, since it is excellent in dimension stability, mass productivity and thermal stability. Insulation layers 8, 12 may be formed using the same material selected from among the above-listed materials, or materials may be different from each other.

As material for conductive patterns (CPU', CPL'), conductive metals such as copper, aluminum, stainless steel or the like can be used. Copper is preferred from a processability point of view. Conductive patterns (CPU', CPL') may be formed by using a single copper foil as described later, or by plating on a copper foil with carrier. Resistor (PR) formed in the resistor forming region is preferably not in contact with conductive pattern (CPL').

As material for electrodes ($EU_1$, $EU_2$), gold, silver, copper, platinum, palladium, nickel, aluminum, or the like may be used, but nickel is preferred. Those metals are conductive and are resistant to corrosion from an etching solution used to form a later-described top surface pattern.

Electrodes ($EU_1$, $EU_2$) are formed to have at least one layer preferably by a plating method using a metal from the above list. It is preferred to use palladium or nickel which contains a predetermined amount of element as described later, since a resistor can be produced that has high resistance values and an excellent level of resistance to corrosion and chemical substances.

By containing a predetermined amount of element, satisfactory results are achieved, such as prevention of pinholes when forming electrodes, high corrosion resistance to heat, acid or alkali, and fewer chances of resistance value fluctuation when used in a high-temperature air atmosphere. Phosphorus or boric acid may be used for a contained element, but phosphorus is preferred. If the formation of pinholes is prevented when forming electrodes, an inhibitory factor for achieving stable resistance values is reduced and the contact surface area is set constant, since the contact surfaces with the electrodes are made flat and smooth. Therefore, stable resistance values are achieved.

When using nickel as the primary metal, it is preferred to contain phosphorus in the approximate range of 9-11 wt. pct. If the phosphorus content is in that range, the formation of pinholes when forming electrodes can be prevented and corrosion resistance can be also maintained. Also, phosphorus contained in nickel will not be air-oxidized when used in a high temperature air atmosphere, thus the resistance values will not fluctuate. The phosphorus content of approximately 10 wt. pct. is more preferable, since it can provide a dense film with better corrosion resistance and a stable resistance value.

If an almost flat component-mounting surface is formed with electrodes ($EU_1$, $EU_2$) and the (−Z) surface of insulation layer (18U), a printed paste is prevented from disfigurement caused by its flow before setting when resistor (PR) is formed by a printing method. By preventing deformation, resistance values of the resistor can be better stabilized.

Preferably, the thickness of resistor (PR) is formed at the same thickness as conductive pattern (CPL') or thinner. By forming it as such, when another element is mounted on conductive pattern (CPL'), which is a top-surface wiring, any unnecessary load on the resistor can be avoided and disfigurement of the resistor can be prevented, thereby stabilizing its resistance value. Furthermore, another resistor may be disposed directly on top of the resistor formed as described above.

Unlike the above-described conventional printed resistor illustrated in FIG. 10, in the resistor element according to one embodiment of the present invention, electrodes ($EU_1$, $EU_2$) are formed directly under top surface wiring (CPL') as described above, and resistor (PR) is formed in such a way that conductive pattern (CPL') does not touch resistor (PR).

Therefore, the resistance value of resistor (PR) does not fluctuate according to the thickness of the conductive layer. Also, the resistance value can be stabilized, since the contact surface area between the resistor and the electrodes can be kept constant regardless of the conductive layer thickness.

Also, since resistor (PR) is formed on an almost level plane as mentioned above, the (+Z) surface of resistor (PR) is made flat. Thus, configuration change due to contraction before curing is very small. Accordingly, fluctuations in the resistance values of resistor (PR) can be suppressed.

Next, manufacturing steps of PWB 10 are described as follows. First, conductive film (CF) with carrier is prepared as shown in FIG. 2A. Regarding conductive film (CF) with carrier, on (+Z) surface of supporting material (hereinafter may be referred to as "carrier material" or "carrier") (12c), conductive film (2a) such as a copper film or the like is laminated.

Above conductive film (CF) with carrier can be produced by press-laminating conductive film (2a) on a surface of carrier material (12c). Conductive film (2a) is glued by using adhesives containing benzotriazole or benzotriazole derivatives, for example, VERZONE (SF-310, made by Daiwa Fine Chemical Co., Ltd.) in such a way that it can be peeled-off later. Products on the market may also be selected for use accordingly. As such commercial products, ones which allow carrier and the conductive film, for example, Micro Thin (made by Mitsui Mining and Smelting Co., Ltd.), XTR (made by Olin Corporation), UTC-Foil (made by Metfoils AB), or the like, to be separated later can be listed.

For conductive film (CF) with carrier, a conductive film is laminated to both (+Z) and (−Z) surfaces of carrier may also be used. Conductive films may be disposed on both surfaces of the carrier in the way described above.

Figure 2B:
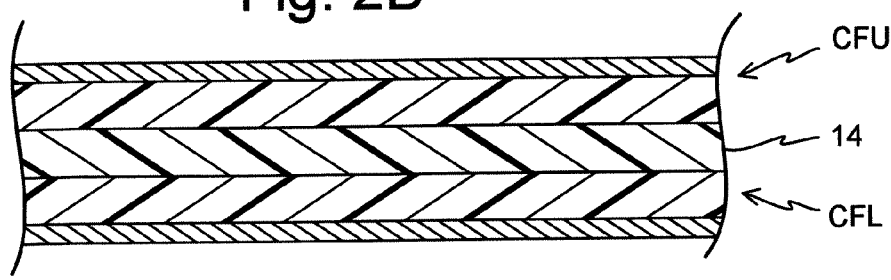
FIG. 2B is an illustration describing another manufacturing step for the PWB shown in FIG. 1 (the second step)

Two sheets of above-described conductive film (CF) with carrier are prepared and laminated on the (+Z) and (−Z) surfaces of the insulation layer, prepreg 14, with a predetermined thickness, by applying heat and pressure (see FIG. 2B). Here, conductive film (CF) laminated on the (+Z) surface of prepreg 14 is referred to as (CFU), and conductive film (CF) laminated on the (−Z) surface is referred to as (CFL). For prepreg 14, for example, R1551 with a thickness of 0.15 mm (made by Matsushita Electric Works, Ltd.) can be used.

Figure 2C:
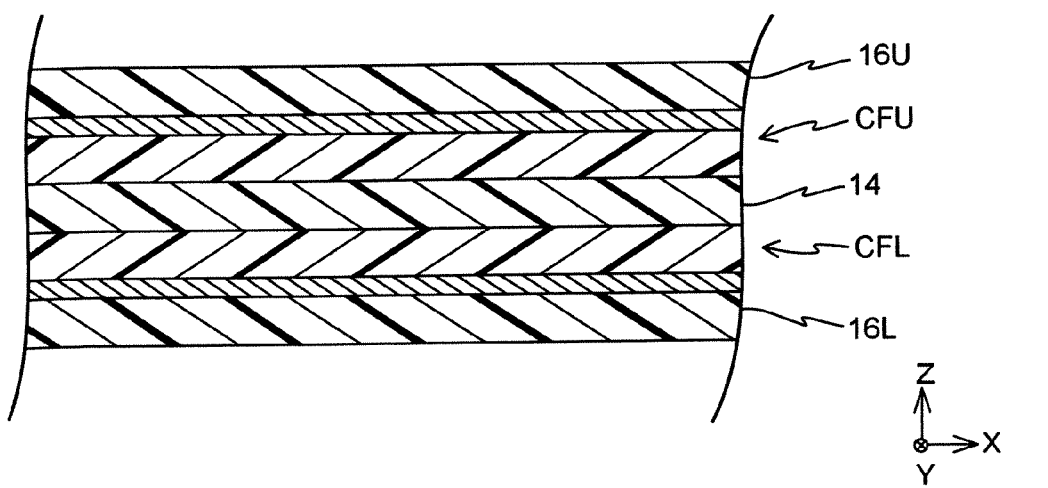
FIG. 2C is an illustration describing yet another manufacturing step for the PWB shown in FIG. 1 (the third step)

Then, dry film resist is laminated both on the (+Z) surface of conductive film (CFU) with carrier and the (−Z) surface of conductive film (CFL) to form mask resist layers (16U, 16L) (see FIG. 2C). Here, as resist material to form resist layers 16, for example, dry film SA-150 (made by DuPont) and H9040 (made by Hitachi Chemical Co., Ltd.) can be used. Also, liquid resist material such as PER-20 (made by Taiyo Ink Mfg. Co., Ltd.) can be used.

Next, resist layers (16U, 16L) on the electrode forming regions on (CFU) are removed to form concave portions (OU$_1$, OU$_2$, OL$_1$, OL$_2$). Accordingly, predetermined sizes are exposed in the electrode forming regions on the (+Z) surface of conductive film (CFU) with carrier and the (−Z) surface of conductive film (CFL) with carrier (see FIG. 3A). A conventional photolithographic method or the like may be used to form resist layers (16U', 16L') where portions of the electrode forming regions are removed.

Then, using a plating method with a bath containing a desired composition or methods such as PVD, CVD or the like, electrodes (EU$_1$, EU$_2$) are formed on the exposed portions of film (CFU) with carrier, and electrodes (EL$_1$, EL$_2$) are formed on the exposed portions of film (CFL) with carrier.

Figure 3A:
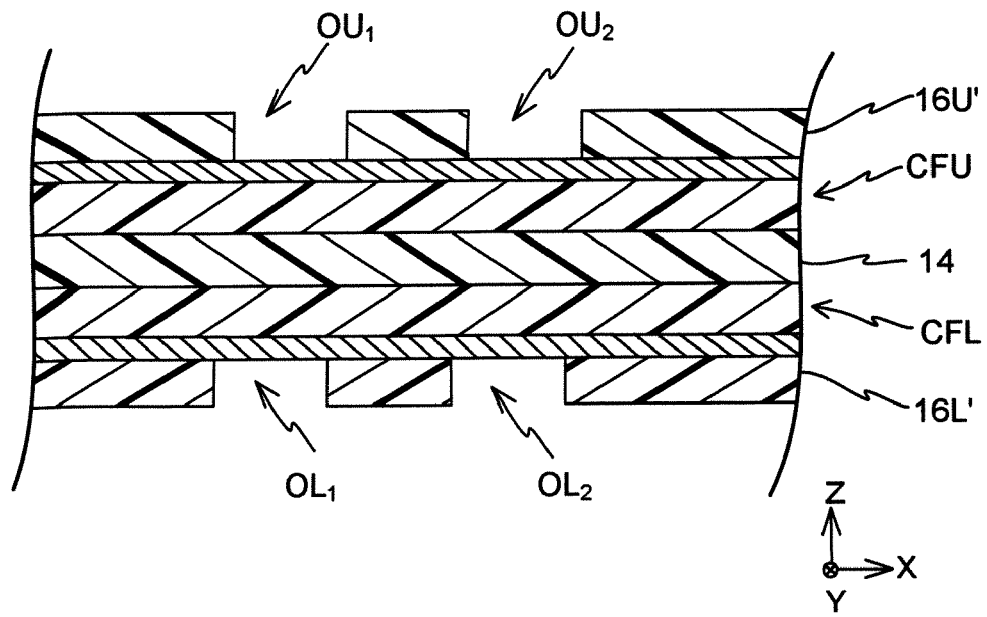
FIG. 3A is an illustration describing yet another manufacturing step for the PWB shown in FIG. 1 (the fourth step)
Figure 3B:
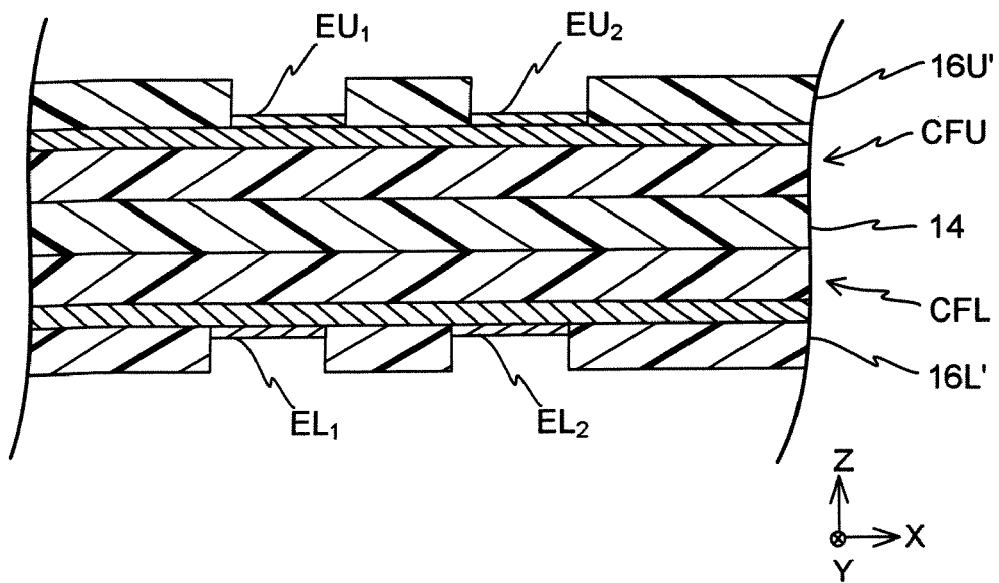
FIG. 3B is an illustration describing yet another manufacturing step for the PWB shown in FIG. 1 (the fifth step)
Figure 3C:
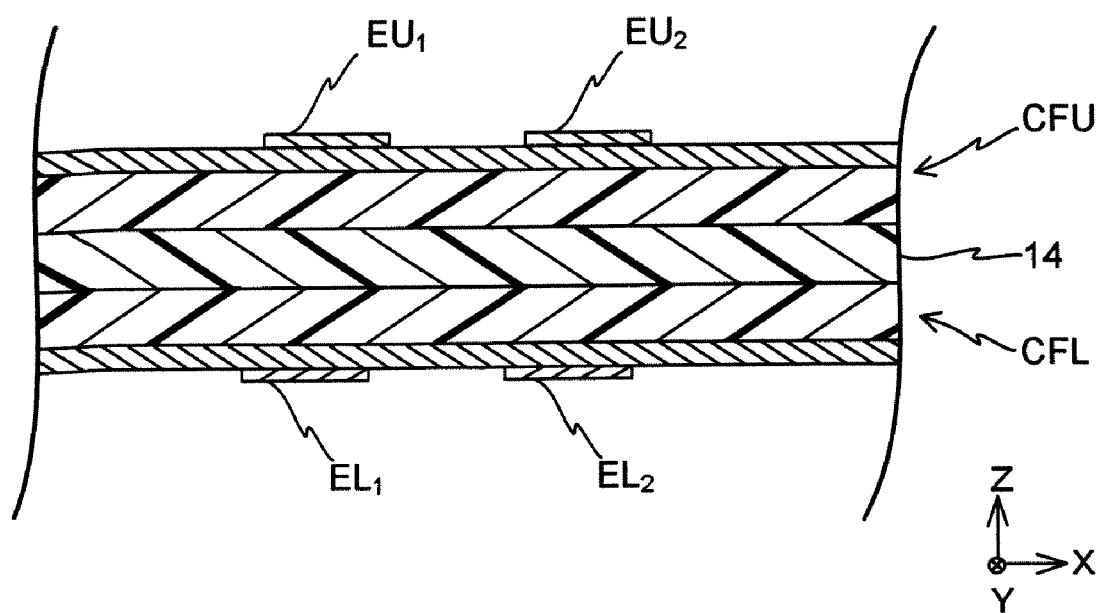
FIG. 3C is an illustration describing yet another manufacturing step for the PWB shown in FIG. 1 (the sixth step)

When using a plating method, by properly adjusting the bath composition and plating conditions (such as pH, temperature, and the current density and energized time of electricity to be used if using electrolytic plating), electrodes (EU$_1$, EU$_2$, EL$_1$, EL$_2$) can be formed, each having a predetermined plated-layer thickness (see FIG. 3B).

Specifically, for example, an electroless plating method using a plating bath as shown in Table 1 below can be applied and electroless plating can be performed under conditions calling for a temperature in the approximate range of 60-90° C. and plating time of approximately 30-50 minutes. As a result, electrodes (EU$_1$, EU$_2$, EL$_1$, EL$_2$) can be formed, each having an average thickness in the range of 4-6 μm and phosphorus as a contained element in a predetermined amount. Following the above step, resist layers (16U', 16L') are removed (see FIG. 3B).

TABLE 1 composition of electroless nickel-phosphorus bath

| chemical compound names | amount (g/L) |
| --- | --- |
| nickel sulfate | 21-26 |
| sodium hypophosphite | 20-25 |
| sodium acetate | approx. 25 |
| sodium citrate | approx. 15 |
| sulfuric acid | an appropriate amount |

Alternatively, plating using a nickel sulfate plating bath (pH 4-5) with the composition shown in Table 2 below can be performed under predetermined conditions, for example, at a temperature in the approximate range of 40-60° C. and approximate electrical current density of 2-6 A/dm$^2$ for about 30 seconds to two minutes. As a result, electrodes (EU$_1$, EU$_2$, EL$_1$, EL$_2$) can be formed, each having an average thickness in the range of 4-6 μm.

TABLE 2 composition of electrolytic nickel bath

| Chemical compound names | Amount (g/L) |
| --- | --- |
| nickel sulfate | approx. 300 |
| nickel chloride | approx. 50 |
| boric acid | approx. 40 |

Figure 4A:
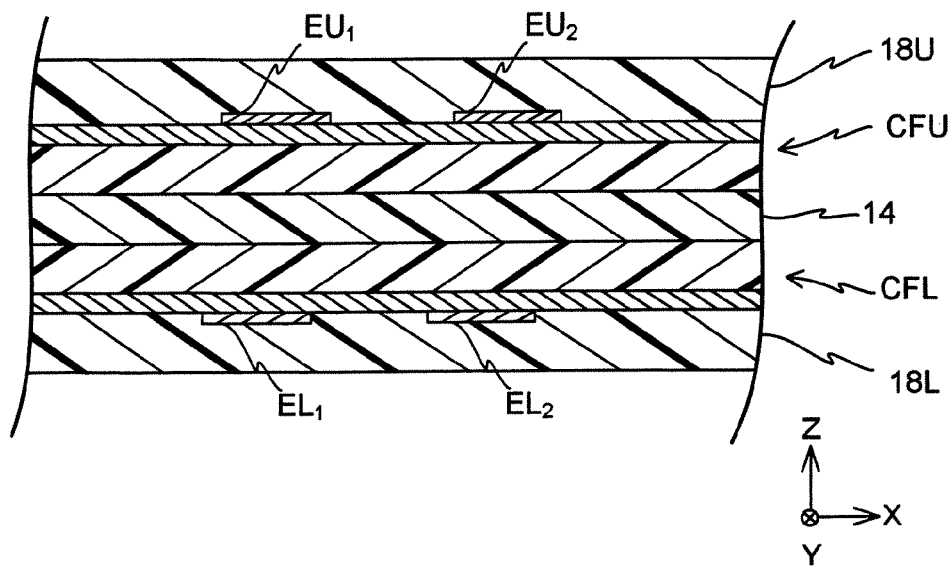
FIG. 4A is an illustration describing a manufacturing step to produce a component to be used in the PWB shown in FIG. 1 (the seventh step)
Figure 4B:
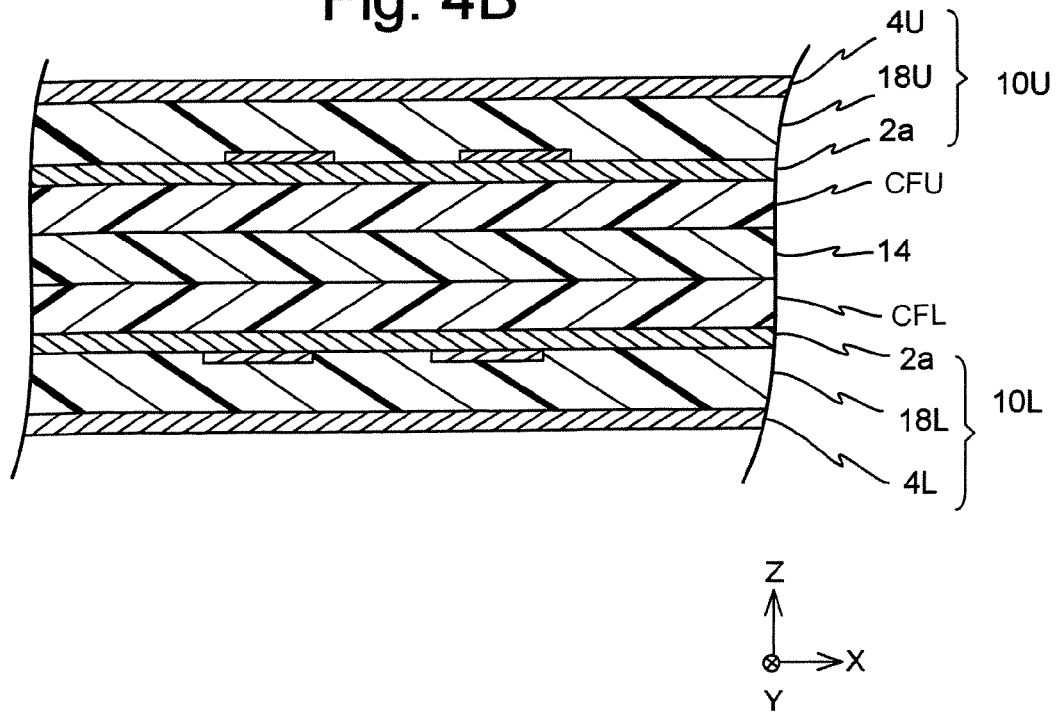
FIG. 4B is an illustration describing another manufacturing step to produce a component to be used in the PWB shown in FIG. 1 (the eighth step)
Figure 4C:
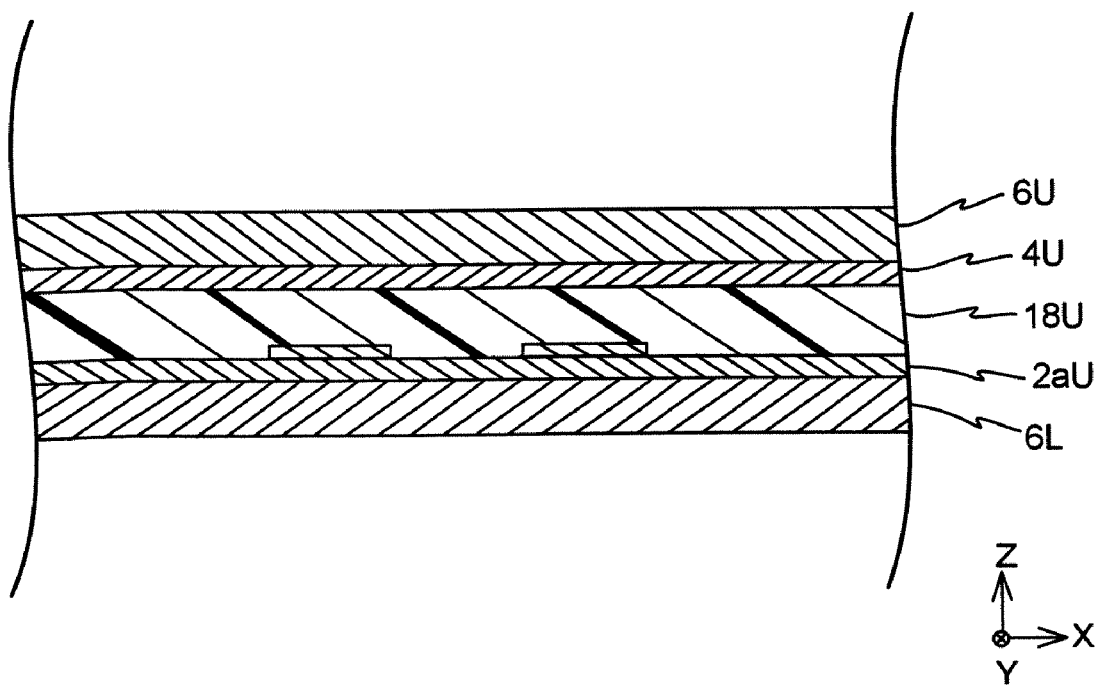
FIG. 4C is an illustration describing yet another manufacturing step to produce a component to be used in the PWB shown in FIG. 1 (the ninth step)
Figure 5A:
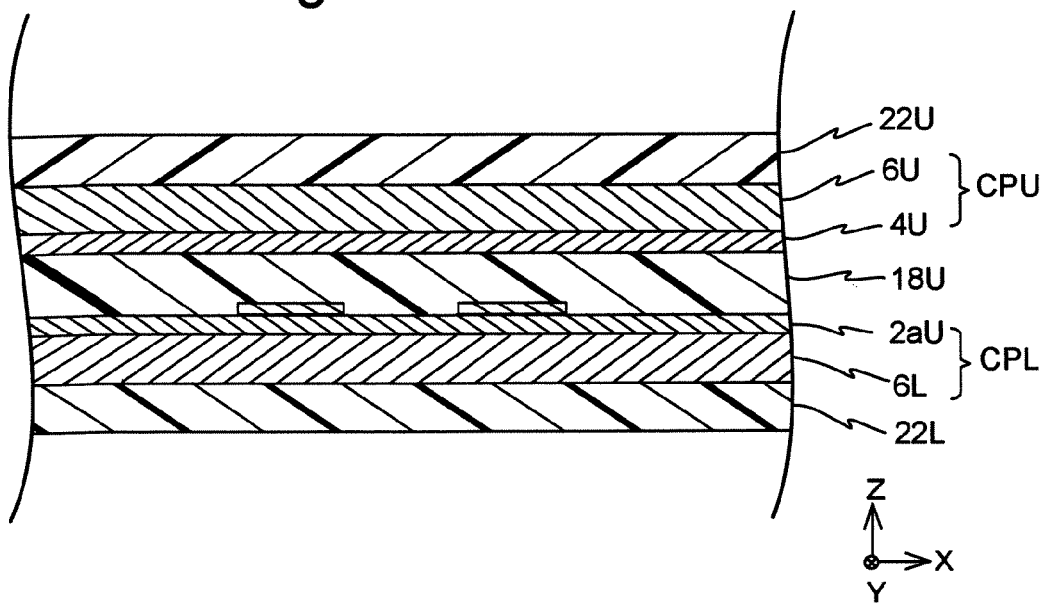
FIG. 5A is an illustration describing yet another manufacturing step for the PWB shown in FIG. 1 (the $10^{th}$ step)
Figure 5B:
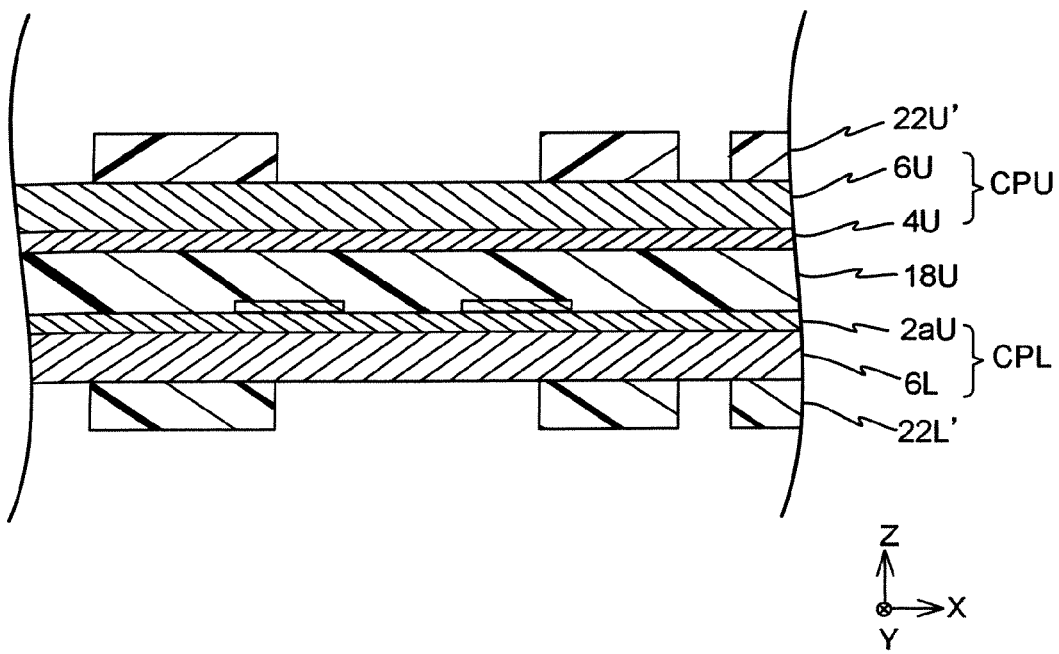
FIG. 5B is an illustration describing yet another manufacturing step for the PWB shown in FIG. 1 (the $11^{th}$ step)

Then, prepregs (18U, 18L) are laminated on the surface formed by film (CFU) with carrier and electrodes (EU$_1$, EU$_2$), and the surface formed by film (CFL) with carrier and electrodes (EL$_1$, EL$_2$), respectively (see FIG. 4A). For the prepreg used above, for example, R1551 (made by Matsushita Electric Works, Ltd.) or the like can be used.

Next, conductive layer (4U) is disposed on the (+Z) surface of prepreg (18U), conductive layer (4L) is disposed on the (−Z) surface of prepreg (18L) and heat and pressure are applied to laminate. For the conductive layers above, for example, a copper foil with a thickness in the range of 12-18 μmm may be used (see FIG. 4B).

Then, conductive film (2a) of conductive film (CFU) with carrier is removed from carrier (12c) to form component (10U). Conductive film (2a) of conductive film (CFL) is also removed from carrier (12c) to form component (10L). In the following, a case using component (10U) is described as an example. Then, for example, by using a plating bath with the composition shown in Table 3 below, electrolytic copper-plated layers (6U, 6L) are formed respectively on the (+Z) surface and (−Z) surface of component (10U) (see FIG. 4C).

The electrolytic copper plating process may be conducted under the conditions of, for example, a current density in the approximate range of 1 A-3 A/dm$^2$, plating time of about 15-60 minutes, and temperature in the approximate range of 20-30° C. Above metal conductive film (2a) and plated layer (6L) formed here will form the later-described conductive pattern (CPU'), and conductive film (4U) laminated as described above and plated layer (6U) will form the later-described conductive pattern (CPL'). By properly adjusting the pH, temperature, electrical current density and energized time of the plating, electrolytic copper-plated layers with a desired thickness can be formed.

TABLE 3 composition of electrolytic copper bath

| Chemical compound names | Amount |
|---|---|
| sulfuric acid | approx. 180 (g/L) |
| copper sulfate | approx. 80 (g/L) |
| additive*[1] | approx. 1 m/L |

*[1]Cupracid GL, made by Atotech Japan

After forming plated layers (6U, 6L), on the (+Z) surface of plated layer (6U) and (−Z) surface of plated layer (6L), mask resist layers (22U, 22L) are formed in the same manner as described above (see FIG. 5A). To form mask resist layers (22U, 22L), the above-described dry film resist or liquid resist can be used.

In the following, the resist of mask resist layers (22U, 22L) is removed from regions, excluding portions where the conductive patterns are formed, by a conventional photolithographic method. Accordingly, the conductive films in the above regions are exposed, thereby forming mask resist layers (22U', 22L') (see FIG. 5B).

Figure 6A:
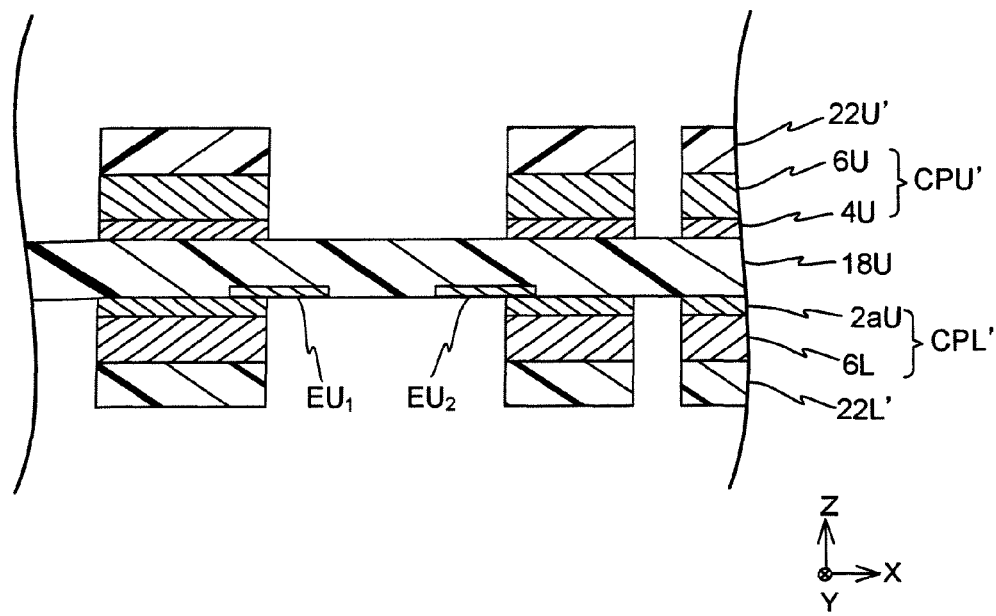
FIG. 6A is an illustration describing yet another manufacturing step for the PWB shown in FIG. 1 (the $12^{th}$ step)
Figure 6B:
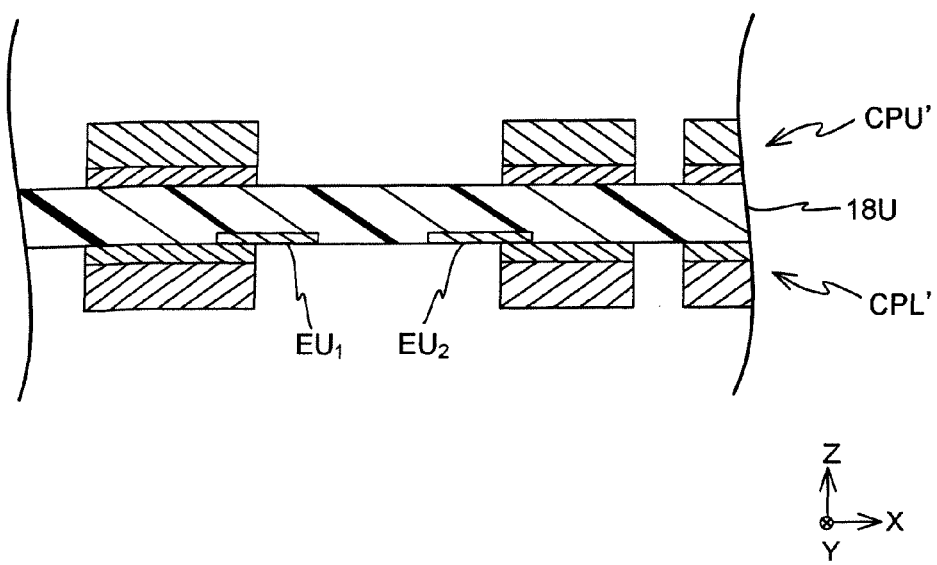
FIG. 6B is an illustration describing yet another manufacturing step for the PWB shown in FIG. 1 (the $13^{th}$ step)

Next, etching is conducted until the (+Z) surface and (−Z) surface of insulation layer (18U) are exposed, thereby removing above-exposed plated layer (6U) and conductive film (4U) beneath it, and plated layer (6L) and conductive film (2a) beneath it (see FIG. 6A). Then, mask resist layers (22U', 22L') are removed by a conventional photolithographic method and conductive patterns (CPU', CPL') are formed (see FIG. 6B). Further, a black oxide treatment is conducted using a chemical such as NaOH, NaClO$_2$, or Na$_3$PO$_4$, at a temperature in the range of 70-98° C., the approximate concentration of each chemical being NaOH: 10 g/L, NaClO$_2$: 40 g/L and Na$_3$PO$_4$: 6 g/L.

After forming conductive patterns (CPU', CPL'), the whole unit is turned upside down. Then, excluding the resistor forming region, the (−Z) surface of insulation layer (18U), as well as the (−Z) surfaces of the conductive patterns (CPU', CPL') and electrodes (EU$_1$, EU$_2$), are covered by screen mesh (M) (see FIG. 7A). A resistor is formed by a screen printing method using a carbon paste (see FIG. 7B). Then, component 100 is formed after the screen mesh is removed (see FIG. 7C).

On the component-mounting surface, the (−Z) surface of insulation layer (18U) and the (−Z) surfaces of electrodes (EU$_1$, EU$_2$) are formed almost flat, i.e., substantially leveled. This has the advantage that, after resistor (PR) is formed by the above-mentioned printing method, the paste does not flow before the resin, such as phenol-resin, contained in the paste is thermally cured, and thus resistor (PR) is seldom deformed.

Figure 7A:
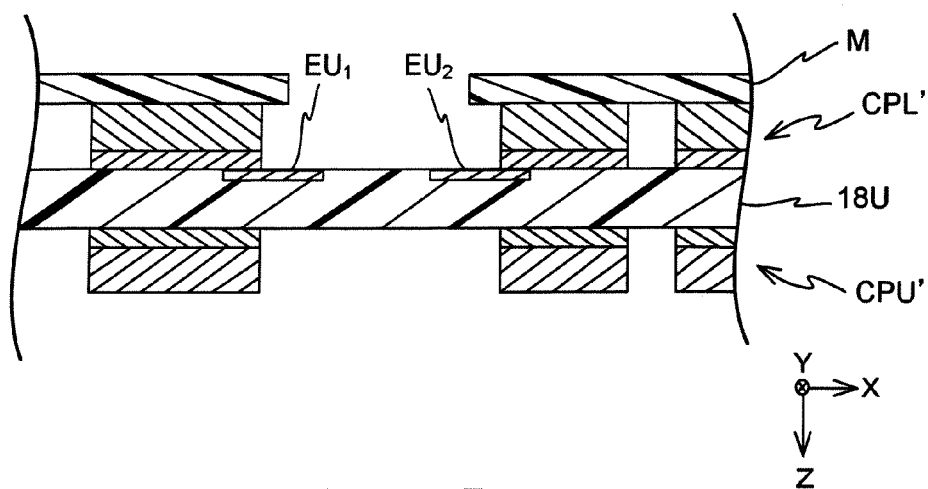
FIG. 7A is an illustration describing yet another manufacturing step for the PWB shown in FIG. 1 (the $14^{th}$ step)
Figure 7B:
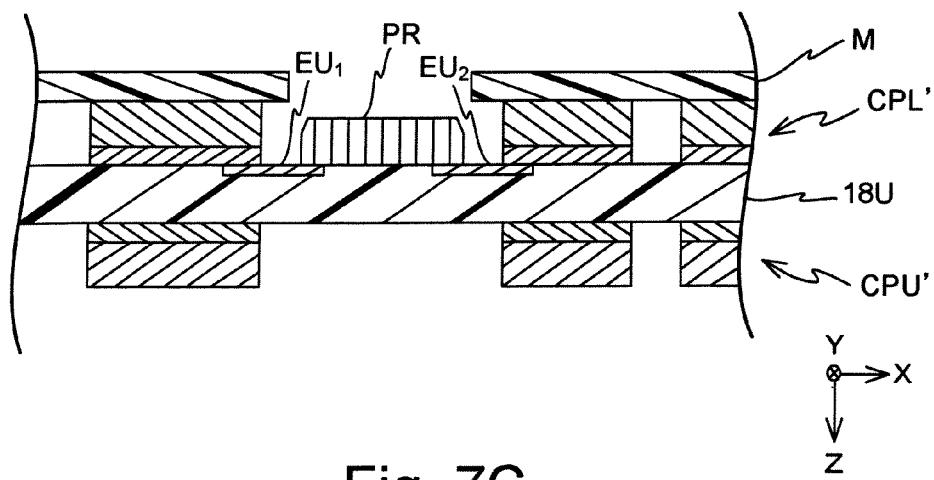
FIG. 7B is an illustration describing yet another manufacturing step for the PWB shown in FIG. 1 (the $15^{th}$ step)
Figure 7C:
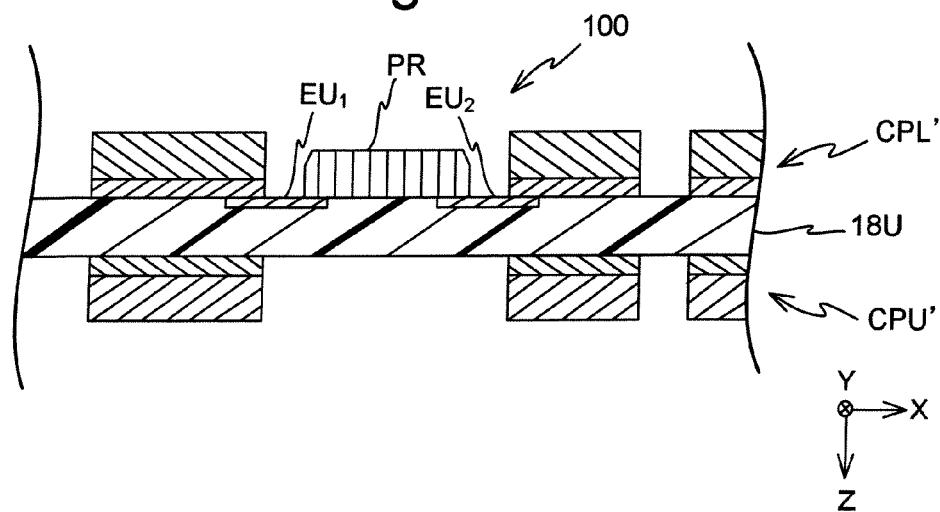
FIG. 7C is an illustration describing yet another manufacturing step for the PWB shown in FIG. 1 (the $16^{th}$ step)
Figure 8A:
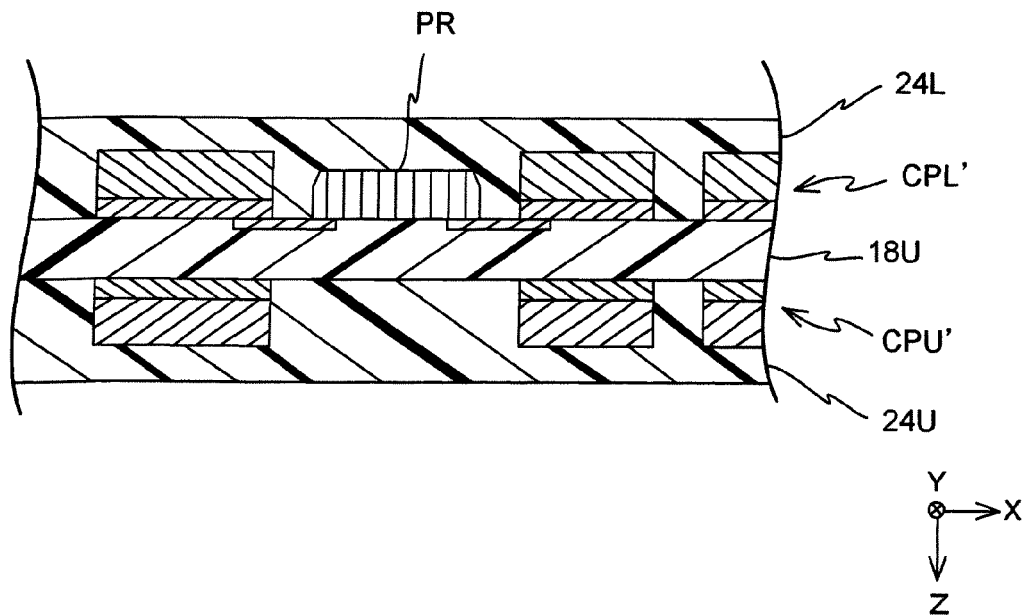
FIG. 8A is an illustration describing a manufacturing step for a PWB where the PWB shown in FIG. 1 is embedded in an internal layer (the first step)
Figure 8B:
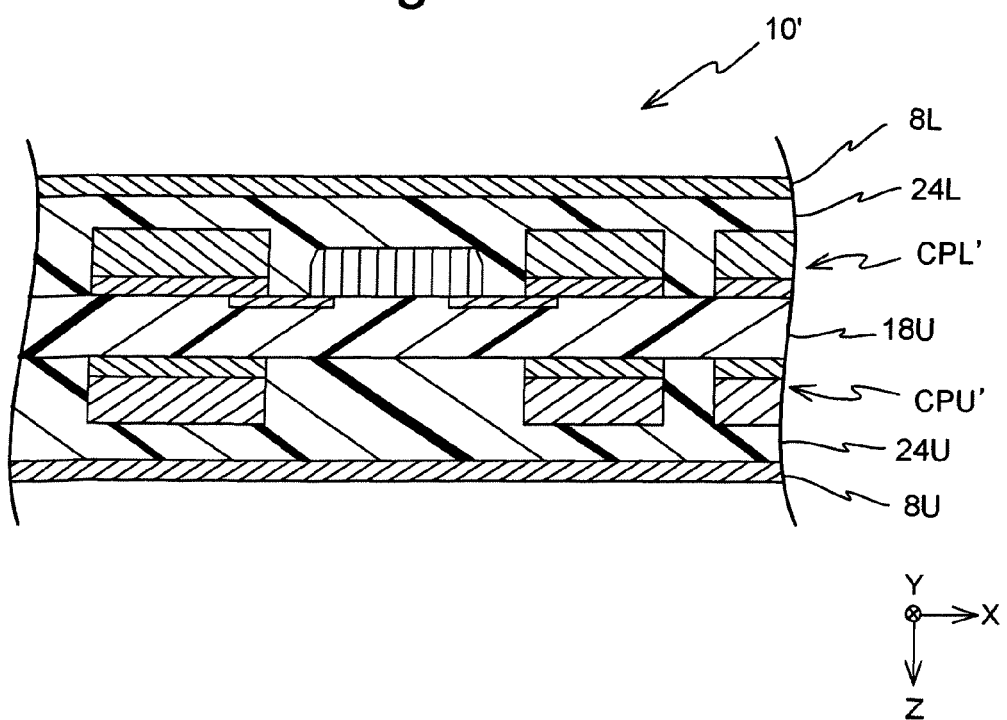
FIG. 8B is an illustration describing another manufacturing step for a PWB where the PWB shown in FIG. 1 is embedded in an internal layer (the second step)

Next, on both (+Z) and (−Z) surfaces of component 100 illustrated in FIG. 7C, a prepreg such as the above-mentioned prepreg is disposed, for example, then heat and pressure are applied to laminate and thus form insulation layers (24U, 24L) (see FIG. 8A). Subsequently, conductive film (8L) is laminated on the (−Z) surface of insulation layer (24L) of component 100, and conductive film (8U) is laminated on the (+Z) surface of insulation layer (24U), then heat and pressure are applied to each layer to form laminated component (10') (see FIG. 8B). Conductive films to be used here include, for example, the copper foil described above or the like.

To form insulation layers (24U, 24L), other than laminating the above prepreg, an adhesive such as ones described above can be coated to a predetermined thickness or more, and conductive film (8L) is disposed on the (−Z) surface of insulation layer (24L), and conductive film (8U) is disposed on the (+Z) surface of insulation layer (24U), then heat and pressure are applied to laminate.

Then, via-holes for interlayer connection may be formed, for example, by using a laser at positions where conductive patterns (CFU', CFL') are formed (see FIG. 8C). Then, an electroless plating treatment is performed by using a similar plating bath described with reference to Table 1 under the similar conditions, followed by an electrolytic plating treatment by using a similar plating bath described with reference to Table 2 under the similar conditions. As such, PWB 200 is obtained, with an embedded resistor element according to one embodiment of the present invention (FIG. 8D).

The above embodiment is described using a method of manufacturing a PWB where a resistor element is embedded in an internal layer of the PWB. However, as illustrated in FIG. 9C, a resistor element according to one embodiment of the present invention may be formed on an outermost layer of the PWB.

Figure 9A:
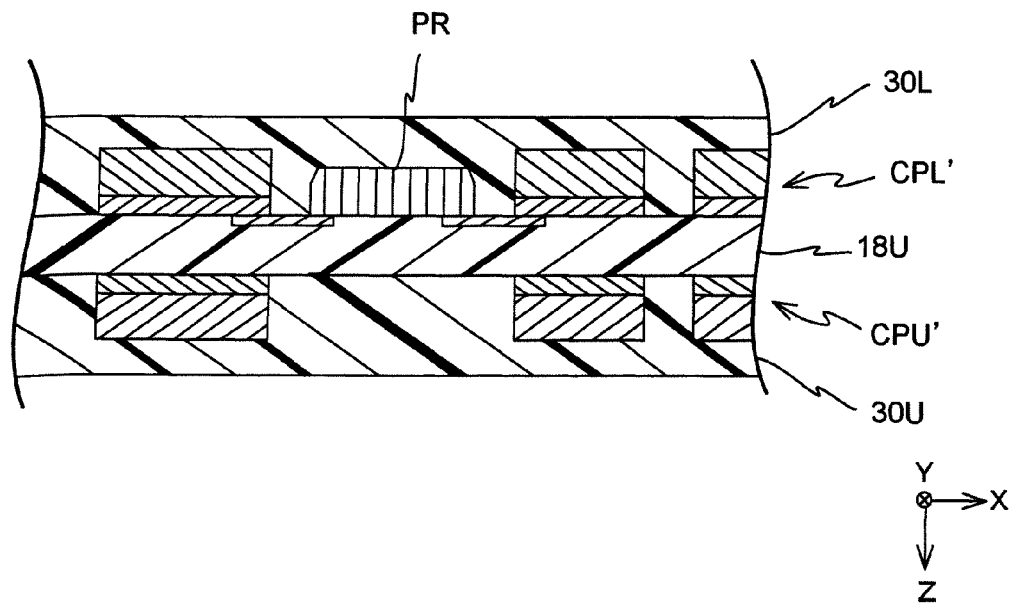
FIG. 9A is an illustration describing a manufacturing step for a PWB where the PWB shown in FIG. 1 is arranged in an external layer (the first step)
Figure 9B:
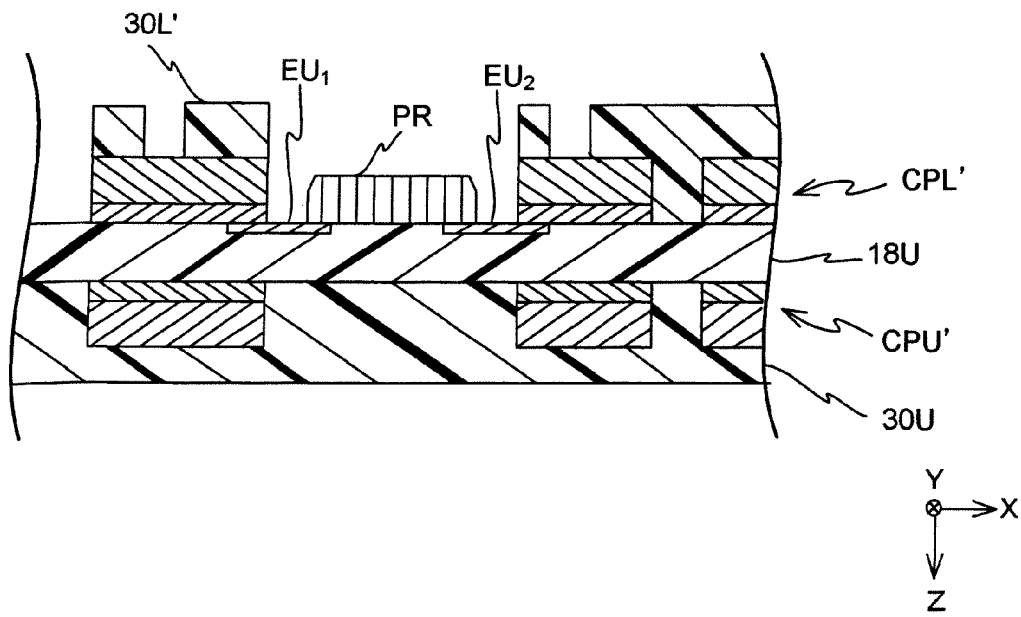
FIG. 9B is an illustration describing another manufacturing step for a PWB where the PWB shown in FIG. 1 is arranged in an external layer (the second step)
Figure 9C:
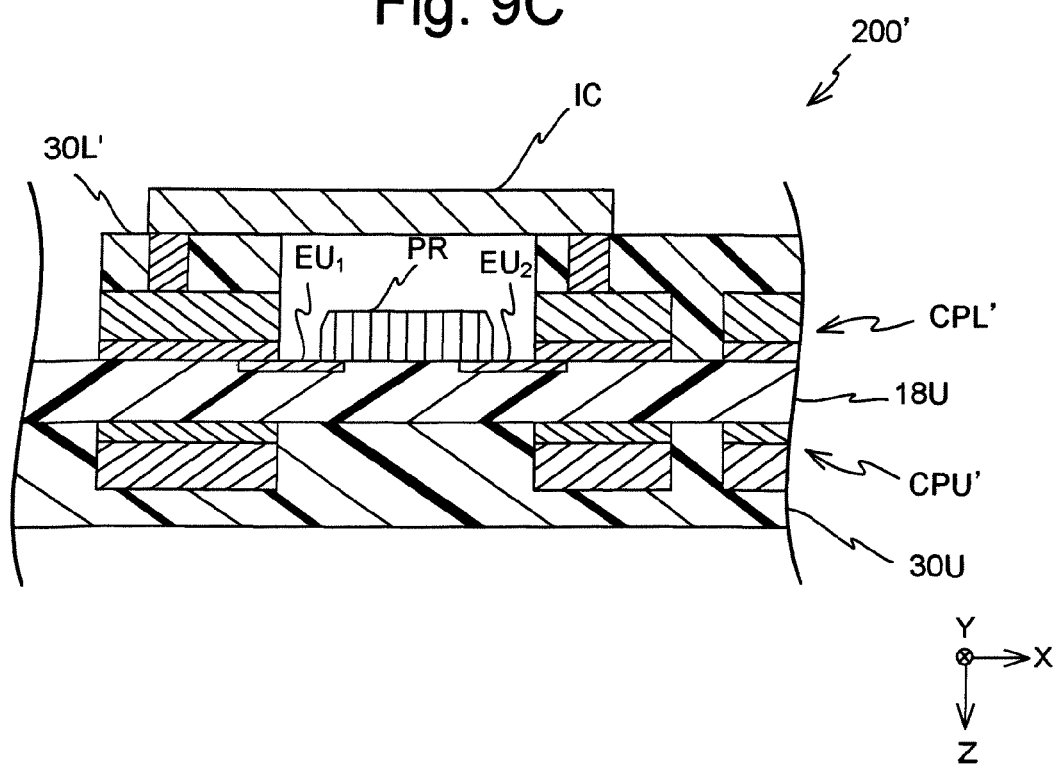
FIG. 9C is an illustration describing yet another manufacturing step for a PWB where the PWB shown in FIG. 1 is arranged in an external layer (the third step)

In such a case, solder mask layers (30U, 30L) are formed on both (+Z) and (−Z) surfaces of above component 100 by coating, for example, a photosensitive resin or laminating dry resist layers (see FIG. 9A). Solder mask (30L') is formed by removing the resin from the predetermined sections of solder mask layer (30L) using a photolithographic method (see FIG. 9B). Then, a die paste such as die bonding paste EPINAL (made by Hitachi Chemical Co., Ltd.) or the like is coated on the area where element IC will be bonded, then heat is added after element IC is mounted. As a result, PWB (200') is produced with a mounted element IC (see FIG. 9C).

EXAMPLES

Manufacturing methods of a PWB according to one embodiment of the present invention, and the characteristics of the produced PWB are described in detail using examples. However, the present invention is not limited to the following examples in any respects.

Example 1

Two conductive films with carrier, Micro Thin (made by Mitsui Mining and Smelting Co., Ltd.) were prepared, and each film was laminated on each surface of a 0.15 mm-thick prepreg with carriers facing the prepreg surfaces. Then, a mask resist layer was formed by laminating a dry film resist, dry film SA-150 (made by DuPont), on the surface of each conductive film with carrier.

Next, the dry resist layer in the electrode forming region was removed using a photolithographic method and the conductive film in the electrode forming region was exposed. Then, an electroless plating was performed using the nickel-phosphorus bath with pH 4-6 shown in Table 4 below at 75° C. for 40 minutes to form electrodes with a plated thickness of 5 μm. The composition of the electrodes was nickel 90 wt. pct. and phosphorus 10 wt. pct.

TABLE 4 composition of electroless nickel-phosphorus bath

| chemical compound names | amount (g/L) |
|---|---|
| nickel sulfate | 25 |
| sodium hypophosphite | 20-25 |
| sodium acetate | approx. 25 |
| sodium citrate | approx. 15 |
| sulfuric acid | an appropriate amount |

After forming the electrodes as described above, the mask resist layer was removed by a photolithographic method.

Above that, a prepreg (a 150 μm-thick R1551, made by Matsushita Electric Works, Ltd.) and a copper foil were disposed and laminated using hydro-press equipment under conditions of 200° C., 40 kgf, and pressure time of three hours.

Next, each of two conductive films with carriers, which were laminated to face the prepreg, was removed at interface between each conductive film and carrier. Then, an electrolytic copper plating treatment was performed using the plating bath having a composition shown in Table 5 below, under conditions calling for the current density 2 A/dm$^2$, plating time of 30 minutes and temperature of 25° C.

TABLE 5

| composition of electrolytic copper plating bath | |
| --- | --- |
| Chemical compound names | Amount (g/L) |
| sulfuric acid | approx. 180 (g/L) |
| copper sulfate | approx. 80 (g/L) |
| additive*[1] | approx. 1 m/L |

*[1]Cupracid GL, made by Atotech Japan

Following the above, the aforementioned dry film resist (H9040, made by Hitachi Chemical Co., Ltd.) was disposed on the conductive film surfaces. Then, portions of the conductive film were exposed after the resist layer was removed by using a photolithographic method to leave an area that would form a conductive pattern. Next, after the exposed portions of the conductive film were removed by etching to form a conductive pattern, the resist layer on the conductive pattern was removed.

Then, a black oxide treatment was applied under conditions similar to those above to enhance the adhesiveness between the conductive pattern and the later-described insulation layer. After the above, the insulation layer surface and electrode surfaces excluding the resistor forming region were covered by a screen mesh (M) as shown in FIG. 7A, and a resistor was formed in the resistor forming region by a screen printing using a carbon paste (TU-15-8M, made by Osaka Asahi Kenkyusho). Then, the screen mesh was removed, and the paste was set by infrared rays to finally produce a sample of Example 1.

Example 2

A sample having electrodes with a thickness (a plated thickness) of 5 μm according to Example 2 was manufactured following the same steps as in Example 1, except the composition of the nickel-phosphorus plating bath (pH 4-6) listed in the above Table 4 was adjusted so that the composition of electrodes are made of nickel 91.0 wt. pct. and phosphorus 9.0 wt. pct.

Example 3

A sample having electrodes with a thickness (a plated thickness) of 5 μm according to Example 3 was manufactured following the same steps as in Example 1, except the composition of the nickel-phosphorus plating bath (pH 4-6) listed in the above Table 4 was adjusted so that the composition of electrodes are nickel 89.0 wt. pct. and phosphorus 11.0 wt. pct.

Comparative Example 1

A conductive pattern was produced the same way as in Example 1, except that electrodes were not formed. The electrode portions were formed on the conductive pattern by plating silver. Then, a sample of Comparative Example 1 was produced by forming a resistor, employing a screen printing using a carbon paste in the concave portion.

Evaluation Results

The samples produced according to the above Examples 1-3 and Comparative Example 1 were evaluated by conducting the tests shown in Table 6 below. Whether corrosion occurred or not was determined by observing the appearance. Regarding the resistance stability, bias was measured by a moisture absorption bias method (hereinafter referred to as HHBT) and the resistance fluctuation rates obtained were used as an indicator. Here, the above HHBT indicates a high-temperature and constant-humidity bias test (ED-4701 102) set by JEITA.

TABLE 6

| | | electrodes | | | evaluation results | |
| --- | --- | --- | --- | --- | --- | --- |
| | | | necessary | | | |
| Samples | conductive metal | primary metal | contained element | content (%) | appearance | resistance fluctuation rate (%) |
| Example 1 | Cu | Ni | phosphorus | 10.0 | no corrosion | 3.79 |
| 2 | Cu | Ni | phosphorus | 9.0 | no corrosion | 4.27 |
| 3 | Cu | Ni | phosphorus | 11.0 | no corrosion | 4.09 |
| Comparative Example 1 | Cu | electrodes not formed | | | corrosion observed | 13.90 |

The results are shown in Table 6. The resistor of Comparative Example 1 showed a high resistance fluctuation rate, 13.9%, whereas Examples 1-3 showed low resistance fluctuation rates in the approximate range of 3.8-4.1%. The resistor according to embodiments of the present invention was found to be excellent in resistance stability.

As described above, a PWB according to one embodiment of the present invention can provide PWB featuring a resistor element that has stable resistance values with high accuracy, and thus are useful for printed wiring boards used in electronic components for communication equipment or the like.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A printed wiring board comprising:
an insulation layer having a surface;
a plurality of electrodes embedded in the insulation layer and having surfaces exposed from the surface of the insulating layer, respectively;
a resistor formed on the surface of the insulation layer and directly connected to the electrodes through the surfaces of the electrodes; and
an external connection conductive pattern formed over the surface of the insulation layer and directly connected to at least one of the electrodes through the surface of the at least one of the electrodes,
wherein the insulation layer and the electrodes form a component-mounting surface on the surface of the insulation layer, the component-mounting surface is substantially leveled with the surface of the insulation layer and includes a resistor forming region on which the resistor is formed, and the external connection conductive pattern over the surface of the insulation layer is separated from the resistor on the surface of the insulation layer by a space.

2. The printed wiring board according to claim 1, further comprising a second insulation layer embedding the resistor and the external connection conductive pattern.

3. The printed wiring board according to claim 2, wherein the second insulation layer contains fibers or inorganic fillers.

4. The printed wiring board according to claim 3, wherein the fibers or the inorganic fillers comprise glass.

5. The printed wiring board according to claim 1, wherein the electrodes comprise a metal and a contained element.

6. The printed wiring board according to claim 5, wherein the metal of the electrodes comprises nickel.

7. The printed wiring board according to claim 5, wherein the contained element comprises phosphorus.

8. The printed wiring board according to claim 6, wherein the contained element comprises phosphorus and the phosphorus is contained in the nickel in an approximate range of 9 to 11 wt. pct.

9. The printed wiring board according to claim 1, wherein the resistor has a thickness which is set to be less than a thickness of the external connection conductive pattern.

10. The printed wiring board according to claim 9, wherein the external connection conductive pattern comprises a metal foil and a metal plating.

11. The printed wiring board according to claim 10, wherein the metal plating comprises copper.

12. The printed wiring board according to claim 9, wherein the electrodes have a thickness which is set to be less than a thickness of the external connection conductive pattern.

13. The printed wiring board according to claim 9, further comprising a second insulation layer embedding the resistor and the external connection conductive pattern.

14. The printed wiring board according to claim 13, wherein the external connection conductive pattern is subjected to a black oxide treatment.

15. The printed wiring board according to claim 13, further comprising a via-hole structure formed in the second insulation layer and electrically connected to the external connection conductive pattern.

16. The printed wiring board according to claim 15, wherein the via-hole structure is filled with a conductive resin.

17. The printed wiring board according to claim 15, wherein the via-hole structure is filled with a metal by plating.

18. A printed wiring board comprising:
an insulation layer having a surface;
a plurality of electrodes embedded in the insulation layer and having surfaces exposed from the surface of the insulating layer, respectively;
a resistor formed on the surface of the insulation layer and directly connected to the electrodes through the surfaces of the electrodes; and
an external connection conductive pattern formed over the surface of the insulation layer and directly connected to at least one of the electrodes through the surface of the at least one of the electrodes,
wherein the insulation layer and the electrodes form a component-mounting surface on the surface of the insulation layer, the component-mounting surface is substantially leveled with the surface of the insulation layer and includes a resistor forming region on which the resistor is formed, and the resistor on the surface of the insulation layer has a thickness which is set to be less than a thickness of the external connection conductive pattern and is separated from the external connection conductive pattern over the surface of the insulation layer by a space over the component-mounting surface.

19. The printed wiring board according to claim 18, wherein the external connection conductive pattern is formed with a metal foil and a metal plating.

20. The printed wiring board according to claim 19, wherein the metal plating comprises copper.

21. The printed wiring board according to claim 18, wherein the electrodes have a thickness which is set to be less than a thickness of the external connection conductive pattern.

22. The printed wiring board according to claim 18, further comprising a second insulation layer embedding the resistor and the external connection conductive pattern.

23. The printed wiring board according to claim 22, wherein the external connection conductive pattern is subjected to a black oxide treatment is applied.

24. The printed wiring board according to claim 22, further comprising a via-hole structure formed in the second insulation layer and electrically connected to the external connection conductive pattern.

25. The printed wiring board according to claim 24, wherein the via-hole structure is filled with a conductive resin.

26. The printed wiring board according to claim 24, wherein the via-hole structure is filled with a metal by plating.

* * * * *